United States Patent
Lee et al.

(10) Patent No.: US 12,125,956 B2
(45) Date of Patent: Oct. 22, 2024

(54) SEMICONDUCTOR DEVICE AND SEMICONDUCTOR COMPONENT INCLUDING THE SAME

(71) Applicant: EPISTAR CORPORATION, Hsinchu (TW)

(72) Inventors: Yu-Tsu Lee, Hsinchu (TW); Yi-Yang Chiu, Hsinchu (TW); Chun-Wei Chang, Hsinchu (TW); Min-Hao Yang, Hsinchu (TW); Wei-Jen Hsueh, Hsinchu (TW); Yi-Ming Chen, Hsinchu (TW); Shih-Chang Lee, Hsinchu (TW); Chung-Hao Wang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 594 days.

(21) Appl. No.: 17/203,402

(22) Filed: Mar. 16, 2021

(65) Prior Publication Data

US 2022/0302360 A1  Sep. 22, 2022

(51) Int. Cl.
*H01L 33/62* (2010.01)
*H01L 33/10* (2010.01)
(Continued)

(52) U.S. Cl.
CPC .............. *H01L 33/62* (2013.01); *H01L 33/10* (2013.01); *H01L 33/30* (2013.01); *H01L 33/387* (2013.01)

(58) Field of Classification Search
CPC ................. H01L 33/405; H01L 27/156; H01L 33/387; H01L 33/62; H01L 33/10; H01L 33/30; H01L 33/46
See application file for complete search history.

(56) References Cited

U.S. PATENT DOCUMENTS

| 6,169,298 B1* | 1/2001 | Lin .................. H01L 33/02 257/E33.07 |
| 2015/0349220 A1* | 12/2015 | Moon ................. H01L 33/405 257/98 |

(Continued)

FOREIGN PATENT DOCUMENTS

KR    20130067147 A    *  6/2013    ........... H01L 33/405

OTHER PUBLICATIONS

KR-20130067147-A English translation 2013.*

(Continued)

*Primary Examiner* — Latanya N Crawford Eason
(74) *Attorney, Agent, or Firm* — DITTHAVONG, STEINER, & MLOTKOWSKI (57) ABSTRACT

A semiconductor device is provided, which includes a semiconductor stack and a first contact structure. The semiconductor stack includes an active layer and has a first surface and a second surface. The first contact structure is located on the first surface and includes a first semiconductor layer, a first metal element-containing structure and a first p-type or n-type layer. The first metal element-containing structure includes a first metal element. The first p-type or n-type layer physically contacts the first semiconductor layer and the first metal element-containing structure. The first p-type or n-type layer includes an oxygen element (O) and a second metal element and has a thickness less than or equal to 20 nm, and the first semiconductor layer includes a phosphide compound or an arsenide compound.

19 Claims, 9 Drawing Sheets

(51) Int. Cl.
*H01L 33/30* (2010.01)
*H01L 33/38* (2010.01)

(56) References Cited

U.S. PATENT DOCUMENTS

2016/0099386 A1   4/2016  Youn et al.
2019/0326478 A1*  10/2019 Danesh ................ H01L 33/325

OTHER PUBLICATIONS

Zhang et al. "A charge inverter for III-nitride light-emitting diodes", Published in Applied Physics Letters 108, 2016, 6 pages.
Choi et al., "Improvement of the light output of AlGaInP-based light-emitting diode", Published in Journal of Alloys and Compounds 699 (2017) 1180e1185, 6 Pages.
Shao et al., "Metal-insulator-semiconductor structure for deep-ultraviolet light-emitting diodes to increase the electron injection in the cathode region", Published in Superlattices and Microstructures 140 (2020) 106467, 9 pages.

\* cited by examiner

SEMICONDUCTOR DEVICE AND SEMICONDUCTOR COMPONENT INCLUDING THE SAME

FIELD OF DISCLOSURE

The present disclosure relates to a semiconductor device and in particular to a semiconductor optoelectronic device such as a light-emitting diode. The present disclosure also relates to a method for manufacturing the semiconductor device or a semiconductor component including the semiconductor device.

BACKGROUND OF THE DISCLOSURE

Semiconductor devices are widely used in many applications. Various researches and developments of related material used in the semiconductor devices have been conducted. For example, a group III-V semiconductor material containing a group III element and a group V element may be applied to various optoelectronic devices, such as light emitting diodes (LEDs), laser diodes (LDs), photoelectric detectors, solar cells or power devices, such as switches or rectifiers. In recent years, the optoelectronic devices have been widely applied in fields including lighting, medical, display, communication, and sensing systems. The light-emitting diode, which is one of the semiconductor light-emitting devices, has low energy consumption and long operating lifetime, and is therefore widely used in various fields.

SUMMARY OF THE DISCLOSURE

The present disclosure provides a semiconductor device. The semiconductor device includes a semiconductor stack and a first contact structure. The semiconductor stack includes an active layer and has a first surface and a second surface. The first contact structure is located on the first surface and includes a first semiconductor layer, a first metal element-containing structure and a first p-type or n-type layer. The first metal element-containing structure includes a first metal element. The first p-type or n-type layer physically contacts the first semiconductor layer and the first metal element-containing structure. The first p-type or n-type layer includes an oxygen element (O) and a second metal element and has a thickness less than or equal to 20 nm, and the first semiconductor layer includes a phosphide compound or an arsenide compound.

The present disclosure further provides a semiconductor device. The semiconductor device includes a substrate, a reflective structure, a semiconductor stack and a first contact structure. The reflective structure is located on the substrate. The semiconductor stack is located on the reflective structure and includes an active layer. The first contact structure is located between the reflective structure and the semiconductor stack and includes a first semiconductor layer, a first metal element-containing structure including a first metal element, and a first p-type or n-type layer which physically contacts the first semiconductor layer and the first metal element-containing structure. The first p-type or n-type layer comprises an oxygen element (O) and a second metal element and has a thickness less than or equal to 20 nm.

The present disclosure further provides a semiconductor component including the semiconductor device.

DETAILED DESCRIPTION OF THE DISCLOSURE

The following embodiments will be described with accompany drawings to disclose the concept of the present disclosure. In the drawings or description, same or similar portions are indicated with same or similar numerals. Furthermore, a shape or a thickness of a member in the drawings may be enlarged or reduced. Particularly, it should be noted that a member which is not illustrated or described in drawings or description may be in a form that is known by a person skilled in the art.

In the present disclosure, if not otherwise specified, the general formula InGaP represents $In_{x0}Ga_{1-x0}P$, wherein $0<x0<1$; the general formula AlInP represents $Al_{x1}In_{1-x1}P$, wherein $0<x1<1$; the general formula AlGaInP represents $Al_{x2}Ga_{x3}In_{1-x2-x3}P$, wherein $0<x2<1$ and $0<x3<1$; the general formula InGaAsP represents $In_{x4}Ga_{1-x4}As_{x5}P_{1-x5}$, wherein $0<x4<1$ and $0<x5<1$; the general formula AlGaInAs represents $Al_{x6}Ga_{x7}In_{1-x6-x7}As$, wherein $0<x6<1$ and $0<x7<1$; the general formula InGaAs represents $In_{x8}Ga_{1-x8}As$, wherein $0<x8<1$; the general formula AlGaAs represents $Al_{x9}Ga_{1-x9}As$, wherein $0<x9<1$; the general formula InGaN represents $In_{x10}Ga_{1-x10}N$, wherein $0<x10<1$; the general formula AlGaN represents $Al_{x11}Ga_{1-x11}N$, wherein $0<x11<1$; the general formula AlGaAsP represents $Al_{x12}Ga_{1-x12}As_{x13}P_{1-x13}$, wherein $0<x12<1$ and $0<x13<1$; the general formula InGaAsN represents $In_{x14}Ga_{1-x14}As_{x15}N_{1-x15}$, wherein $0<x14<1$ and $0<x15<1$; the general formula AlInGaN represents $Al_{x16}In_{x17}Ga_{1-x16-x17}N$, wherein $0<x16<1$ and $0<x17<1$. The content of each element may be adjusted for different purposes, for example, for adjusting the energy gap, or the peak wavelength or dominant wavelength when the semiconductor device is a light-emitting device.

The semiconductor device of the present disclosure is an optoelectric device (such as light-emitting device (a light-emitting diode or a laser diode)) or a light absorbing device (a photo-detector or solar cell) or a non-optoelectric device. Qualitative or quantitative analysis of the composition and/ or dopant contained in each layer of the semiconductor device of the present disclosure may be conducted by any suitable method, such as, a secondary ion mass spectrometer (SIMS), Energy-dispersive X-ray spectroscopy (EDX), X-ray photoelectron spectroscopy (XPS), or Ultraviolet Photoelectron Spectroscopy (UPS). A thickness of each layer may be obtained by any suitable method, such as a transmission electron microscopy (TEM), a scanning electron microscope (SEM) or a scanning transmission electron microscope (STEM).

A person skilled in the art can realize that other members can be included based on a structure recited in the following embodiments. For example, if not otherwise specified, a description similar to "a first layer/structure is on or under a second layer/structure" can include an embodiment in which the first layer/structure directly (or physically) contacts the second layer/structure, and can also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations. Furthermore, in the present disclosure, a description of "a layer/structure only includes M material" means the M material is the main constituent of the layer/structure; however, the layer/structure may still contain a dopant or unavoidable impurities.

Figure 1:
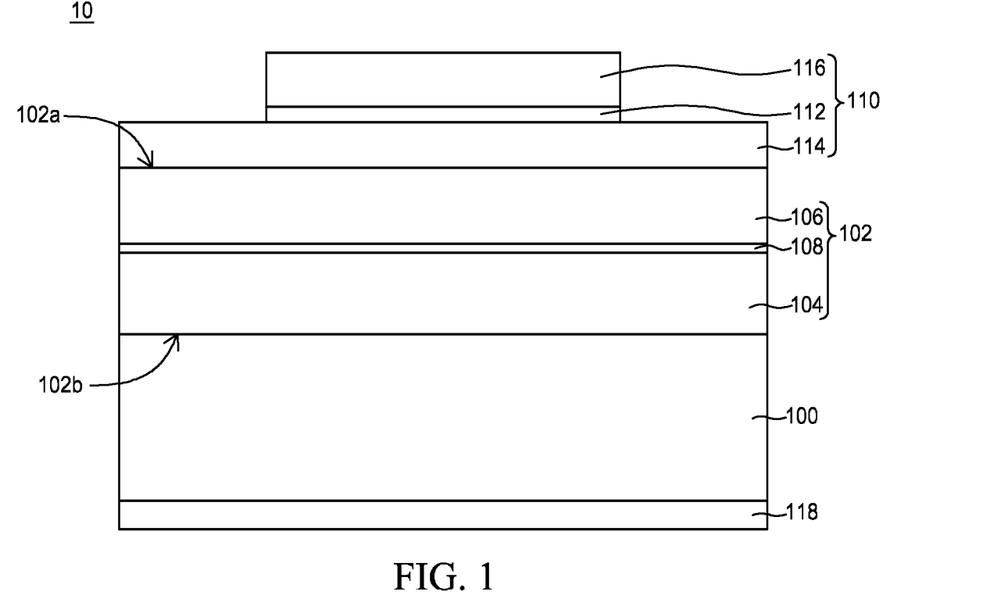
FIG. 1 shows a schematic sectional view of a semiconductor device in accordance with an embodiment of the present disclosure.

FIG. 1 shows a schematic sectional view of a semiconductor device 10 in accordance with an embodiment of the present disclosure.

As shown in FIG. 1, the semiconductor device 10 includes a base 100, and a semiconductor stack 102 on the base 100. In an embodiment, the semiconductor stack 102 is a light-emitting stack. The semiconductor stack 102 can be an epitaxial structure and can include a first semiconductor structure 104, a second semiconductor structure 106, and an active region 108 between the first semiconductor structure 104 and the second semiconductor structure 106. The semiconductor device 10 further includes a first contact structure 110 on the semiconductor stack 102. In the embodiment, the first contact structure 110 includes a p-type or n-type layer 112, a first semiconductor layer 114 located under the p-type or n-type layer 112 and a first metal element-containing structure 116 located on the p-type or n-type layer 112. As shown in FIG. 1, the p-type or n-type layer 112 is located between and physically contacts the first metal element-containing structure 116 and the first semiconductor layer 114. Specifically, the semiconductor stack 102 has a first surface 102a facing the first contact structure 110 and a second surface 102b facing the base 100. In the embodiment, the first contact structure 110 physically contacts the first surface 102a. In addition, the semiconductor device 10 further includes a second electrode 118 under the base 100 for electrically connecting the semiconductor device 10 to an external power source (not shown). In the embodiment, as shown in FIG. 1, the active region 108 has a portion not overlapped the p-type or n-type layer 112 in a vertical direction.

The base 100 includes a conductive or an insulating material. The conductive material includes gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material includes sapphire. In an embodiment, the base 100 is a growth substrate. For example, the semiconductor stack 102 is epitaxially formed on the base 100 by metal organic chemical vapor deposition (MOCVD). In an embodiment, the base 100 is a bonding substrate instead of a growth substrate, and it can be bonded to the semiconductor stack 102 via a bonding structure (as shown in FIG. 3B to FIG. 3G).

The first semiconductor structure 104 and the second semiconductor structure 106 can be respectively a single layer or multiple layers. In an embodiment, the first semiconductor structure 104 includes a first dopant and the second semiconductor structure 106 includes a second dopant so that the first semiconductor structure 104 and the second semiconductor structure 106 have different conductivity types. For example, the first semiconductor structure 104 is n-type and the second semiconductor structure 106 is p-type, or the first semiconductor structure 104 is p-type and the second semiconductor structure 106 is n-type. In an embodiment, the first dopant and the second dopant respectively include a group II, group IV, or group VI element in the periodic table. For example, the first dopant and the second dopant can respectively include C, Zn, Si, Ge, Sn, Se, Mg or Te. The first semiconductor structure 104 and the second semiconductor structure 106 respectively provide electrons and holes, or holes and electrons. In an embodiment, the first semiconductor layer 114 has the same conductivity type as the second semiconductor structure 106.

In an embodiment, the first semiconductor structure 104, the second semiconductor structure 106, the active region 108, and the first semiconductor layer 114 respectively includes a group III-V semiconductor material. In an embodiment, the group III-V semiconductor material contains element(s) of Al, Ga, As, P, N or In. Specifically, in an embodiment, the group III-V semiconductor material is a binary compound semiconductor (such as GaAs, GaP or GaN), a ternary compound semiconductor (such as InGaAs, AlGaAs, InGaP, AlInP, InGaN or AlGaN) or a quaternary compound semiconductor (such as AlGaInAs, AlGaInP, AlInGaN, InGaAsP, InGaAsN or AlGaAsP). In an embodiment, the active region 108 only includes a ternary compound semiconductor (such as InGaAs, AlGaAs, InGaP, AlInP, InGaN, or AlGaN) or a quaternary compound semiconductor (such as AlGaInAs, AlGaInP, AlInGaN, InGaAsP, InGaAsN, or AlGaAsP). The semiconductor stack 102 can be devoid of element N. In some embodiments, the first semiconductor structure 104, the second semiconductor structure 106, the active region 108, and the first semiconductor layer 114 do not include element N. In some embodiments, the first semiconductor structure 104, the second semiconductor structure 106, the active region 108, and the first semiconductor layer 114 respectively include a phosphide compound or an arsenide compound. In an embodiment, the first semiconductor layer 114 includes an oxygen element (0). Specifically, the first semiconductor layer 114 may include a conductive metal oxide compound. The conductive metal oxide compound may have two or more metal elements, such as In, Sn or Zn. In an embodiment, the metal oxide compound includes indium tin oxide (ITO) or indium zinc oxide (IZO).

In accordance with an embodiment, when the semiconductor device 10 is a light emitting device, the active region 108 can emit a light during operation. The light includes visible light or invisible light. The peak wavelength of the light is determined by the material composition of the active region 108. The material of the active region 108 may include a ternary compound semiconductor (such as InGaN, InGaAs, AlGaN, AlGaAs or InGaP) or a quaternary compound semiconductor (such as InGaAsP, AlGaInAs, or AlGaInP). In an embodiment, the semiconductor device 10 can emit a blue light or a deep blue light with a peak wavelength of 400 nm to 490 nm, a green light with a peak wavelength of 490 nm to 550 nm, an ultraviolet light with a peak wavelength of 250 nm to 400 nm, a red light with a peak wavelength of 610 nm to 700 nm, a yellow light with a peak wavelength of 530 nm to 600 nm, or an infrared light with a peak wavelength of 700 nm to 1700 nm.

In an embodiment, the first metal element-containing structure 116 can serve as a first electrode for electrically connecting the semiconductor device 10 to an external power source (not shown). The first metal element-containing structure 116 can be a single layer or multiple layers. In an embodiment, the first metal element-containing structure 116 has a trapezoid shape or a rectangular shape in the sectional view. In an embodiment, the first metal element-containing structure 116 includes a first metal element M1.

In an embodiment, the first metal element-containing structure 116 further includes a second metal element M2 different from the first metal element M1. In an embodiment, the first metal element-containing structure 116 includes an alloy containing the first metal element M1 and the second metal element M2. In an embodiment, the first metal element-containing structure 116 includes a first layer physically contacting the p-type or n-type layer 112 and a second layer located on the first layer. In an embodiment, the first layer includes the first metal element M1 and the second layer includes the second metal element M2. In an embodiment, the first metal element M1 and the second metal element M2 can be respectively selected from Ti, Ni, Al, Zn, Ge, Mo, W, V, Ga, Au or Ag. In an embodiment, the first metal element-containing structure 116 is devoid of Be.

In the embodiment, the first metal element-containing structure 116 does not physically contact the first semiconductor layer 114. The first metal element-containing structure 116 can electrically connect the first semiconductor layer 114 through the p-type or n-type layer 112. In the embodiment, a material of the p-type or n-type layer 112 has a first contact resistivity in a vertical direction, and has a second contact resistivity in a horizontal direction. The second contact resistivity can be higher than the first contact resistivity so that a current mainly flows through the p-type or n-type layer 112 along the vertical direction and the p-type or n-type layer 112 is electrically connected to the first metal element-containing structure 116 and the first semiconductor layer 114. In some embodiments, the first contact resistivity and the second contact resistivity may be measured with units of $\Omega$ cm$^2$. In some embodiments, when the p-type or n-type layer 112 has a conductivity type different from or same as the conductivity type of the first semiconductor layer 114, the p-type or n-type layer 112 can act as a tunneling layer. In some embodiments, when the p-type or n-type layer 112 has a conductivity type same as the conductivity type of the first semiconductor layer 114, the p-type or n-type layer 112 can further reduce an energy barrier (e.g. Schottky barrier) between the first semiconductor layer 114 and the first metal element-containing structure 116. The first semiconductor layer 114 may contain a third dopant the same as the first or second dopant, such as C, Zn, Si, Ge, Sn, Se, Mg or Te. In an embodiment, the first semiconductor layer 114 has a dopant concentration higher than or equal to $1\times10^{19}/cm^3$ for reducing the contact resistance between the first semiconductor layer 114 and the first metal element-containing structure 116.

The material of the first semiconductor layer 114 has a conduction band and a valence band, the bottom edge of the conduction band is denoted as Ec and the top edge of the valence band is denoted as Ev. The material of the p-type or n-type layer 112 has a first work function WF1 and the first metal element M1 has a second work function WF2. In some embodiments, when the first semiconductor layer 114 is of an n-type conductivity, the first work function WF1 fulfills WF1<(Ec+Ev)/2. In some embodiments, when the first semiconductor layer 114 is of a p-type conductivity, the first work function WF1 fulfills WF1>(Ec+Ev)/2. In some embodiments, when the p-type or n-type layer 112 is of an n-type conductivity, the second work function WF2 is greater than the first work function WF1. In some embodiments, when the p-type or n-type layer 112 is of a p-type conductivity, the first work function WF1 is greater than the second work function WF2. In some embodiments, by adopting the material of the first semiconductor layer 114, the p-type or n-type layer 112 and the first metal element-containing structure 116 that fulfill the above-mentioned relationships, a contact resistivity between the p-type or n-type layer 112 and the first metal element-containing structure 116 can be further improved. In an embodiment, the material of the p-type or n-type layer 112 has a bandgap larger than that of the first semiconductor layer 114 to prevent the p-type or n-type layer 112 from absorbing light emitted from the active region 108. In an embodiment, the material of the p-type or n-type layer 112 includes an oxygen element (O) and a third metal element M3. In an embodiment, the third metal element M3 is the same as the first metal element M1 or the second metal element M2 so that an adhesion between the p-type or n-type layer 112 and the first metal element-containing structure 116 can be further improved, and the thermal stability of the semiconductor device 10 may also be elevated. In an embodiment, the third metal element M3 is In, Ti, Al, Zn, Ni, Ga, Mo, V, W, or Nb.

Regarding the metal element contained in the p-type or n-type layer, the p-type or n-type layer 112 can contain only one kind of metal elements. The metal elements may include In, Ti, Al, Zn, Ni, Ga, Mo, V, W, or Nb. In some embodiments, the p-type or n-type layer 112 contains two or more kinds of metal elements. For example, in an embodiment, the p-type or n-type layer 112 further includes a fourth metal element M4 different from the third metal element M3. The third metal element M3 and the fourth metal element M4 can respectively be In, Ti, Al, Zn, Ni, Ga, Mo, V, W, or Nb. In an embodiment, the p-type or n-type layer 112 further includes a group V element (such as N, P or As). Specifically, in an embodiment, the p-type or n-type layer 112 can include a first metal oxide compound formed by the oxygen element and the third metal element M3. In an embodiment, the p-type or n-type layer 112 can further include a second metal oxide compound formed by the oxygen element and the fourth metal element M4. In an embodiment, the p-type or n-type layer 112 can further include a third metal oxide compound formed by the oxygen element and the group V element. For example, the first metal oxide compound or the second metal oxide compound can be n-type (such as $TiO_x$, $InO_x$, $MoO_x$, $VO_x$, $WO_x$, $GaO_x$, or $NbO_x$) or p-type (such as $NiO_x$). The third metal oxide compound can be $PD_x$, $NO_x$ or $AsO_x$. In an embodiment, the p-type or n-type layer 112 has a thickness larger than 0 nm and less than or equal to 20 nm. For example, the thickness of the p-type or n-type layer 112 is within a range of 0.5 nm to 15 nm, such as 1 nm, 2 nm, 3 nm, 4 nm, 5 nm, 6 nm, 7 nm, 8 nm, 9 nm, 10 nm, 11 nm, 12 nm, 13 nm, or 14 nm. In some embodiments, when the thickness of the p-type or n-type layer 112 is less than or equal to 5 nm, the contact resistivity between the first metal element-containing structure 116 and the first semiconductor layer 114 can be improved through a tunneling effect.

In some embodiments, when the first semiconductor layer 114 includes a phosphide or arsenide compound, the presence of the p-type or n-type layer 112 may avoid the formation of an interfacial compound that is generated by a direct contact between the first semiconductor layer 114 and the first metal element-containing structure 116. For example, when the first metal element-containing structure 116 contains Au and the first semiconductor layer 114 is a phosphide compound (such as GaP), the interfacial compound can be $Au_2P_3$ having a bandgap energy smaller than that of the material of the active region 108 and the interfacial compound may absorb the light emitted from the active region 108.

The second electrode 118 can be a single layer or multiple layers. In an embodiment, the second electrode 118 may contain a conductive material. Specifically, the material of the first electrode (the first metal element-containing structure 116) and the material of the second electrode 118 may be the same or different. The second electrode 118 may include metal oxide, metal or alloy. The metal oxide may include ITO, InO, SnO, CTO, ATO, AZO, ZTO, GZO, IWO, ZnO, or IZO. The metal or alloy may include Ge, Be Zn, Au, Pt, Ti, Al, Ni, or Cu. The alloy may include two metal elements selected from the above-mentioned metal elements. For example, the alloy may be GeAuNi, BeAu, GeAu or ZnAu.

Figure 2:
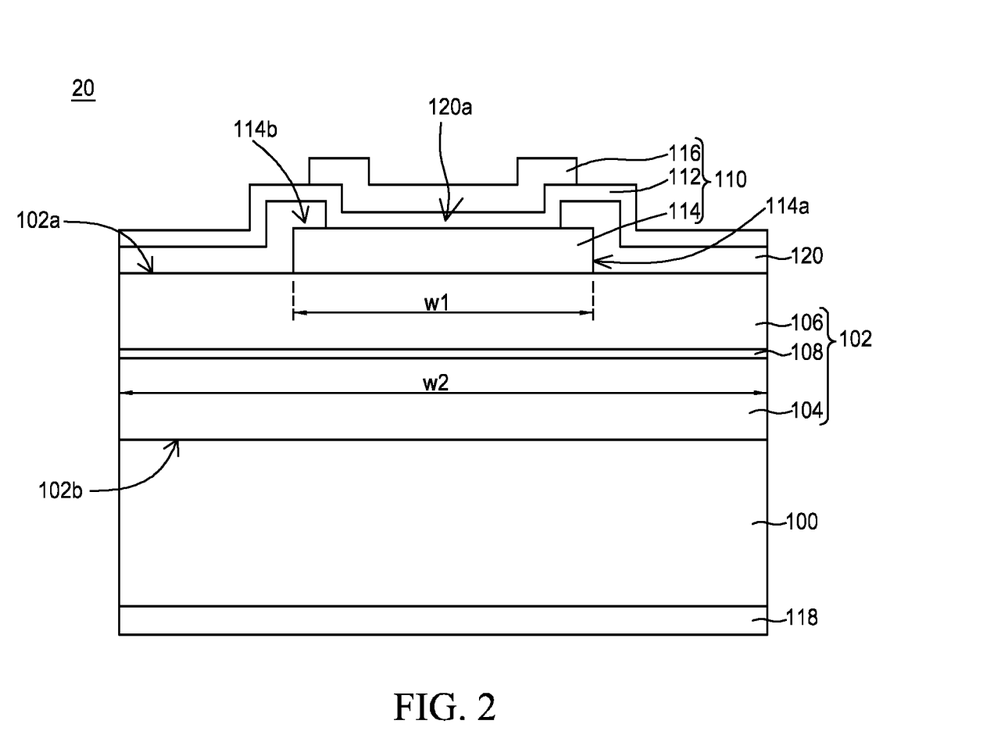
FIG. 2 shows a schematic sectional view of a semiconductor device in accordance with an embodiment of the present disclosure.

FIG. 2 shows a schematic sectional view of a semiconductor device 20 in accordance with an embodiment of the present disclosure.

The difference between the semiconductor device 20 and the semiconductor device 10 is that the semiconductor device 20 further includes an insulating structure 120 on the semiconductor stack 102. In addition, in the embodiment, the first semiconductor layer 114 has a first width w1 less than a second width w2 of the active region 108. As shown in FIG. 2, the first semiconductor layer 114 has a side wall 114a and a third surface 114b, and the insulating structure 120 covers a top surface of the second semiconductor structure 106 (i.e. the first surface 102a in the embodiment), the side wall 114a and a portion of the third surface 114b. Specifically, the insulating structure 120 has an opening 120a and the p-type or n-type layer 112 fills in the opening 120a for physically contacting the first semiconductor layer 114 so that the first semiconductor layer 114 can electrically connect to the p-type or n-type layer 112 and the first metal element-containing structure 116. In the embodiment, the p-type or n-type layer 112 is conformally formed on the first semiconductor layer 114 and the insulating structure 120 and the first metal element-containing structure 116 is conformally formed on the p-type or n-type layer 112.

The insulating structure 120 can be a single layer or multiple layers. In an embodiment, the insulating structure 120 includes a dielectric material such as an oxide compound (such as $SiO_x$), a nitride compound (such as $SiN_x$) or a fluoride compound (such as $MgF_2$). In an embodiment, the insulating structure 120 includes a reflective structure such as a distributed Bragg reflector (DBR) formed by alternately stacking two or more semiconductor materials with different refractive indexes.

For the positions, materials, and related descriptions of other layers or structures, the foregoing embodiments can be referred to, and are not repeatedly described herein.

Figure 3A:
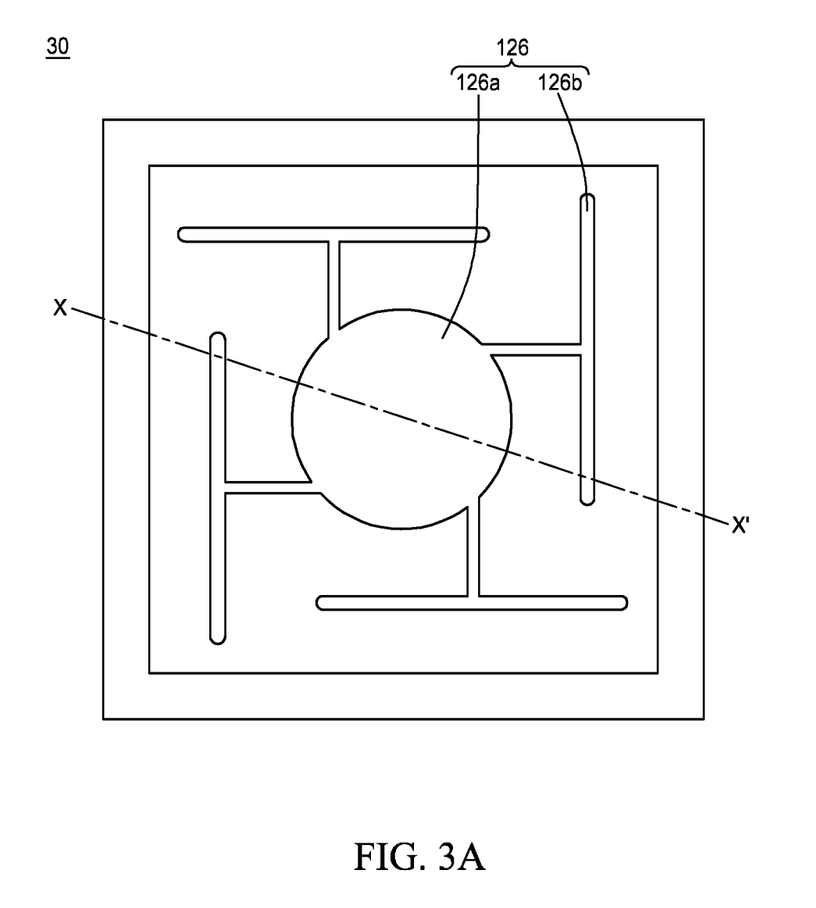
FIG. 3A shows a schematic top view of a semiconductor device in accordance with an embodiment of the present disclosure.
Figure 3B:
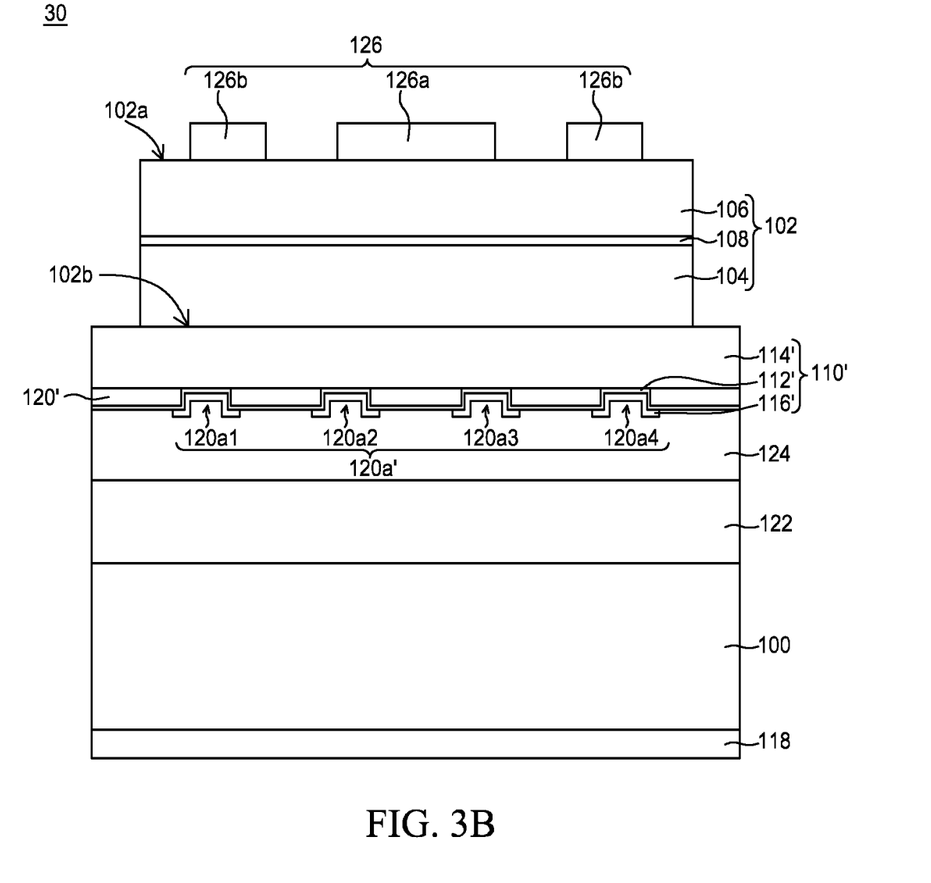
FIG. 3B shows a schematic sectional view of a semiconductor device along X-X' line in FIG. 3A.

FIG. 3A shows a schematic top view of a semiconductor device 30 in accordance with an embodiment of the present disclosure. FIG. 3B shows a schematic sectional view of a semiconductor device 30 along X-X' line in FIG. 3A.

As shown in FIG. 3B, the semiconductor device 30 includes the base 100, and the semiconductor stack 102 on the base 100 as described above. In the embodiment, a first contact structure 110' is provided between the semiconductor stack 102 and the base 100. In the embodiment, the first contact structure 110' physically contacts the second surface 102b of the semiconductor stack 102. In the embodiment, the first contact structure 110' includes a p-type or n-type layer 112', and a first semiconductor layer 114' and a first metal element-containing structure 116' sandwiching the p-type or n-type layer 112'. In addition, the semiconductor device 30 further includes a bonding structure 122 between the first contact structure 110' and the base 100, and a reflective structure 124 between bonding structure 122 and the first contact structure 110'. In the embodiment, a first electrode 126 is formed on the semiconductor stack 102 for electrically connecting the semiconductor device 30 to an external power source (not shown). As shown in FIG. 3A, the first electrode 126 includes an electrode pad 126a and a plurality of extension electrodes 126b, and each of the extension electrodes 126b physically connects to the electrode pad 126a. In this embodiment, the first electrode 126 includes four extension electrodes 126b and each of which has a T shape in the top view.

As shown in FIG. 3B, the first semiconductor layer 114' physically contacts the first semiconductor structure 104. An insulating structure 120' having a plurality of openings 120a' is provided between the first semiconductor layer 114' and the reflective structure 124. For simplicity, the symbol 120a' represents the plurality of openings, and as shown in FIG. 3B, a specific opening can be represented as 120a1, 120a2, 120a3 and 120a4. Specifically, the p-type or n-type layer 112' can fill in the openings 120a' and physically contact to the first semiconductor layer 114' so that the first semiconductor layer 114' can electrically connect to the p-type or n-type layer 112' and the first metal element-containing structure 116'. Multiple current paths can be formed between the first semiconductor layer 114' and the reflective structure 124 during operation of the semiconductor device 30. In the embodiment, the first metal element-containing structure 116' has a first portion formed in the openings 120a' and a second portion outside the openings 120a'. The second portion can be overlapped with the insulating structure 120' in the vertical direction and the first portion is not overlapped with the insulating structure 120' in the vertical direction.

The bonding structure 122 may be a single layer or may include two or more sub-layers (not shown). In the embodiment, the material of the bonding structure 122 is conductive. The bonding structure 122 may include a transparent conductive material, metal or alloy. The transparent conductive material may include ITO, InO, SnO, CTO, ATO, AZO, ZTO, GZO, ZnO, GaP, ICO, IWO, ITiO, IZO, IGO, GAZO, graphene or a combination thereof. The metal may include Cu, Al, Sn, Au, Ag, Pb, Ti, Ni, Pt, or W. The alloy may include two or more metal elements selected from the above-mentioned metal elements.

The reflective structure 124 may include a single layer or multiple layers for reflecting the light emitted from the active region 108 towards the second semiconductor structure 106 and exit out from the semiconductor device 30. The material of the reflective structure 124 may include metal or alloy. The metal may be Cu, Al, Sn, Au, Ag, Pb, Ti, Ni, Pt, or W. The alloy may include two or more metal elements selected from the above-mentioned metal elements.

For the positions, materials, and related descriptions of other layers or structures, the foregoing embodiments can be referred to, and are not repeatedly described herein.

Figure 3C:
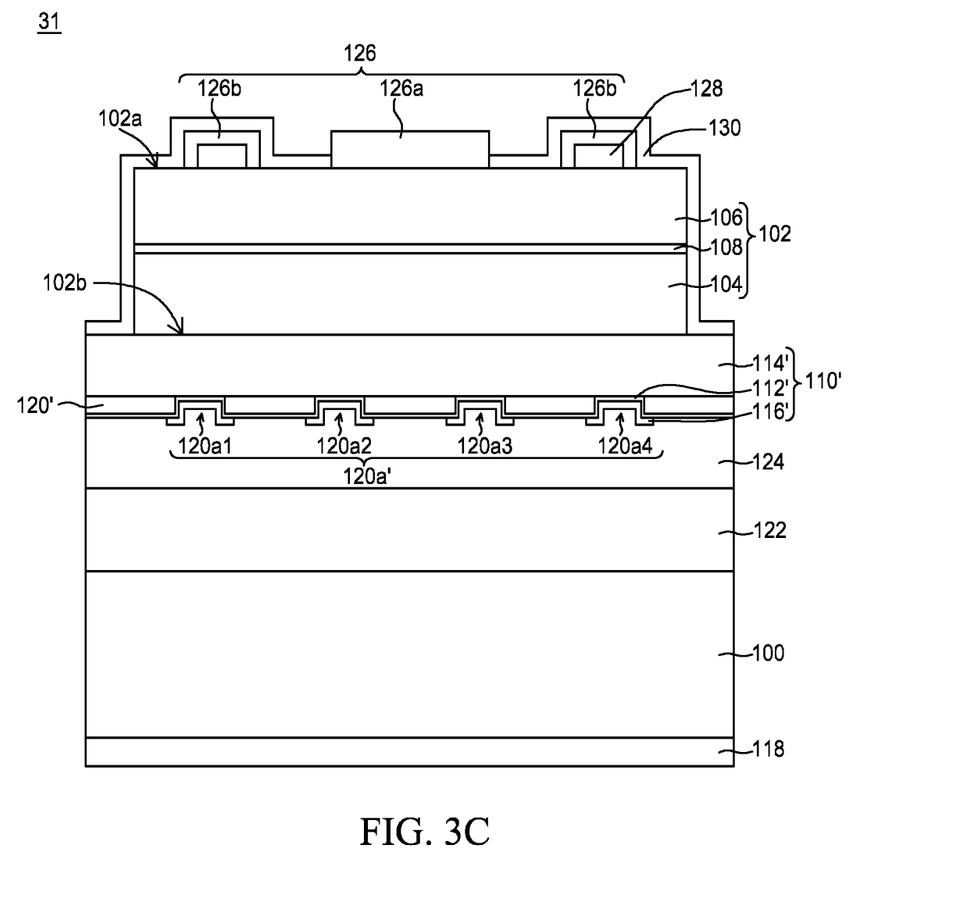
FIG. 3C shows a schematic sectional view of a semiconductor device in accordance with an embodiment of the present disclosure.

FIG. 3C shows a schematic sectional view of a semiconductor device 31 in accordance with an embodiment of the present disclosure.

The difference between the semiconductor device 31 and the semiconductor device 30 is that the semiconductor device 31 further includes a semiconductor contact layer 128 and a protection layer 130 on the semiconductor stack 102. As shown in FIG. 3C, the semiconductor contact layer 128 is covered by the extension electrodes 126*b*. Specifically, a side wall and an upper surface of the semiconductor contact layer 128 physically contact the extension electrodes 126*b*. In an embodiment, the semiconductor contact layer 128 includes a group III-V semiconductor material, such as a binary compound semiconductor (such as GaAs, GaP or GaN) or a ternary compound semiconductor (such as InGaP). With the semiconductor contact layer 128, the contact resistance between the first electrode 126 and the semiconductor stack 102 can be further improved. The protection layer 130 can protect the semiconductor device 31 from moisture or contamination, and can improve the reliability of the semiconductor device 31. In some embodiments, the protection layer 130 includes a dielectric material, such as an oxide compound (such as $SiO_x$), a nitride compound (such as $SiN_x$).

For the positions, materials, and related descriptions of other layers or structures, the foregoing embodiments can be referred to, and are not repeatedly described herein.

Figure 3D:
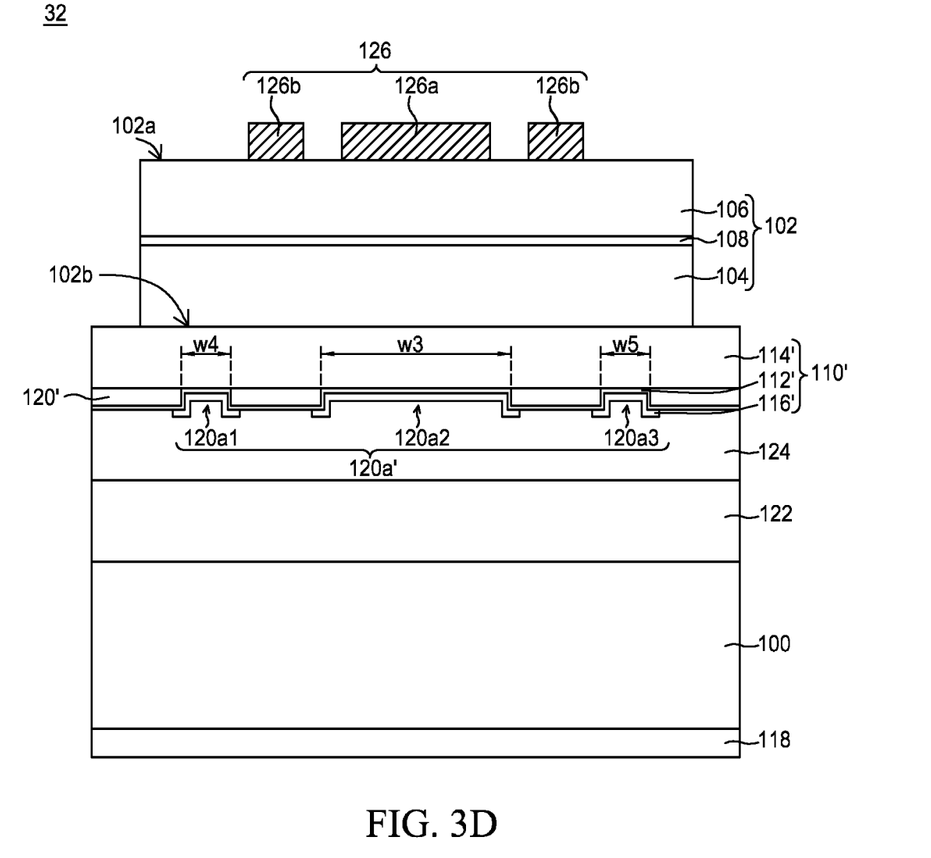
FIG. 3D shows a schematic sectional view of a semiconductor device in accordance with an embodiment of the present disclosure.

FIG. 3D shows a schematic sectional view of a semiconductor device 32 in accordance with an embodiment of the present disclosure.

The difference between the semiconductor device 32 and the semiconductor device 30 lies in the arrangement of the first contact structure 110' and the insulating structure 120'. As shown in FIG. 3D, the plurality of openings 120*a*' includes a first opening 120*a*1, a second opening 120*a*2 and a third opening 120*a*3. The second opening 120*a*2 is overlapped with the electrode pad 126*a*, and the first opening 120*a*1 and the third opening 120*a*3 are not overlapped with the electrode pad 126*a* and the extension electrodes 126*b* in the vertical direction. The second opening 120*a*2 has a third width w3 larger than a fourth width w4 of the first opening 120*a*1 and larger than a fifth width w5 of the third opening 120*a*3. Specifically, in the embodiment, the insulating structure 120' is not overlapped with the electrode pad 126*a* in the vertical direction, and the openings 120*a*' are not overlapped with the extension electrodes 126*b* in the vertical direction.

It should be noted that the arrangement of the first contact structure 110' and the insulating structure 120' as shown in FIG. 3D can also be applied in other embodiments described above (such as the structure of the semiconductor device 31). For the positions, materials, and related descriptions of other layers or structures, the foregoing embodiments can be referred to, and are not repeatedly described herein.

Figure 3E:
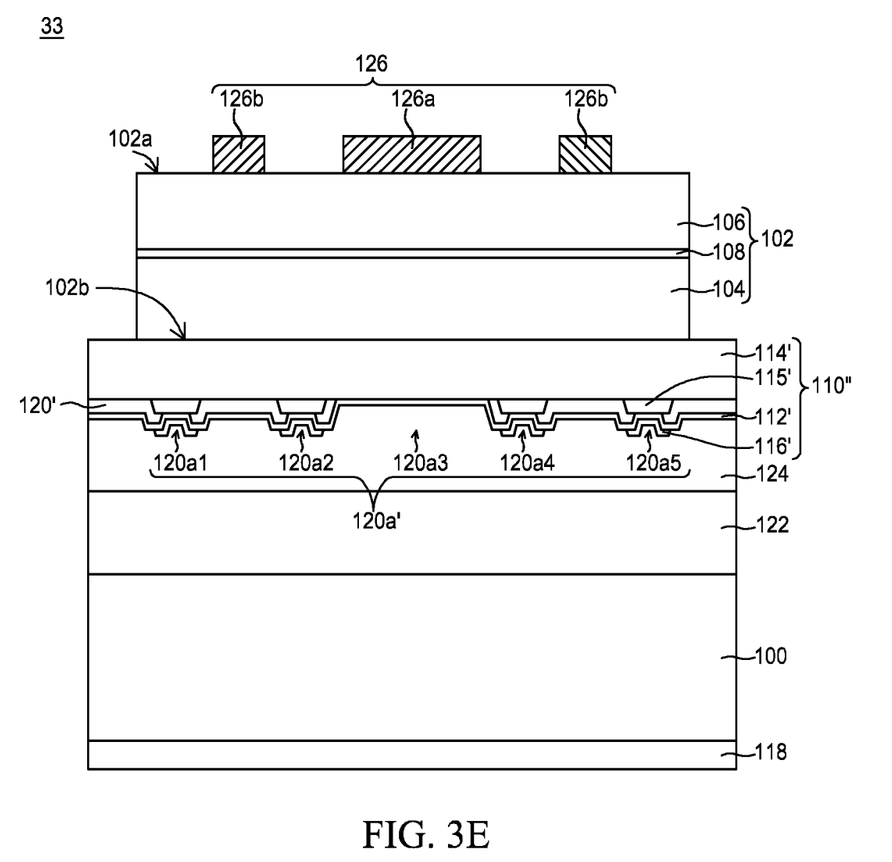
FIG. 3E shows a schematic sectional view of a semiconductor device in accordance with an embodiment of the present disclosure.

FIG. 3E shows a schematic sectional view of a semiconductor device 33 in accordance with an embodiment of the present disclosure.

The difference between the semiconductor device 33 and the semiconductor device 32 lies in the arrangement of the first contact structure 110". As shown in FIG. 3E, the first contact structure 110" further includes a second semiconductor layer 115' between the first semiconductor layer 114' and the p-type or n-type layer 112'. The second semiconductor layer 115' may have a trapezoid shape or a rectangular shape in the sectional view. In the embodiment, the second semiconductor layer 115' is not overlapped with the electrode pad 126*a* and the extension electrodes 126*b* in the vertical direction. In an embodiment, the second semiconductor layer 115' has a material the same as the material of the first semiconductor layer 114'. In an embodiment, the second semiconductor layer 115' has a conductivity type the same as the first semiconductor layer 114' and a dopant concentration higher than that of the first semiconductor layer 114'. In an embodiment, the second semiconductor layer 115' has a dopant concentration higher than or equal to $1\times10^{19}/cm^3$ for reducing the contact resistance between the first semiconductor layer 114' and the first metal element-containing structure 116'. The dopant contained in the second semiconductor layer 115' and the first semiconductor layer 114' can be the same. In the embodiment, the insulating structure 120' covers a side wall of the second semiconductor layer 115', and a portion of a surface of the semiconductor layer 115' is exposed from the insulating structure 120' and physically contacts the p-type or n-type layer 112'. The first metal element-containing structure 116' partially covers the p-type or n-type layer 112' and is overlapped with the second semiconductor layer 115' in the vertical direction. The first metal element-containing structure 116' is not overlapped with the electrode pad 126*a*.

It should be noted that the arrangement of the first contact structure 110" as shown in FIG. 3E can also be applied in other embodiments described above (such as the structure of the semiconductor device 30 or 31). For the positions, materials, and related descriptions of other layers or structures, the foregoing embodiments can be referred to, and are not repeatedly described herein.

Figure 3F:
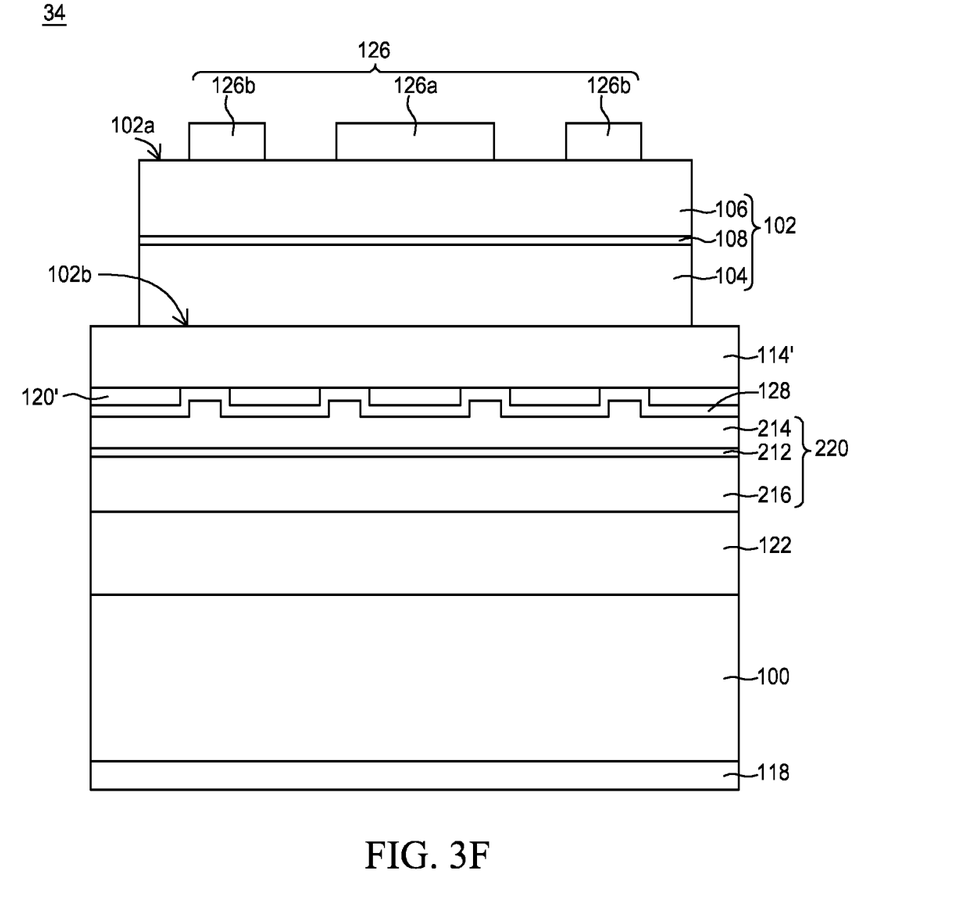
FIG. 3F shows a schematic sectional view of a semiconductor device in accordance with an embodiment of the present disclosure.

FIG. 3F shows a schematic sectional view of a semiconductor device 34 in accordance with an embodiment of the present disclosure.

The semiconductor device 34 shows another arrangement of the contact structure. Specifically, the semiconductor device 34 includes a second contact structure 220 located between the semiconductor stack 102 and the bonding structure 122. In the embodiment, the first semiconductor layer 114' is located between the second contact structure 220 and the semiconductor stack 102.

As shown in FIG. 3F, the semiconductor device 34 further includes a conductive layer 128 between the insulating structure 120' and the second contact structure 220. The second contact structure 220 includes a third semiconductor layer 214, a second metal element-containing structure 216 and a second p-type or n-type layer 212 between the third semiconductor layer 214 and the second metal element-containing structure 216. The materials, and related descriptions of the third semiconductor layer 214, the second p-type or n-type layer 212 and the second metal element-containing structure 216 can be referred to descriptions of the first semiconductor layer 114', the first p-type or n-type layer 112' and the first metal element-containing structure 116'. In the embodiment, the first semiconductor layer 114' and the third semiconductor layer 214 can have difference material. In an embodiment, the first semiconductor layer 114' includes a group III-V semiconductor material and the third semiconductor layer 214 includes a conductive metal oxide compound. In the embodiment, the conductive layer 128 conformally and completely covers the insulating structure 120' to further improve current spreading of the semiconductor device 34, and the second contact structure 220 physically contacts the conductive layer 128 and the bonding structure 122. In the embodiment, the second metal element-containing structure 216 can further serve as a reflective mirror and contain a metal material, such as Ag or Au. In an embodiment, the conductive layer 128 includes a third metal oxide compound and the second semiconductor layer 214 includes a fourth metal oxide compound different from the third metal oxide compound. In an embodiment, the third metal oxide compound and the fourth metal oxide compound can respectively be ITO or IZO.

It should be noted that the arrangement of the second contact structure 220 as shown in FIG. 3F can also be applied in other embodiments described above (such as the structure of the semiconductor device 31). For the positions, materials, and related descriptions of other layers or structures, the foregoing embodiments can be referred to, and are not repeatedly described herein.

Figure 3G:
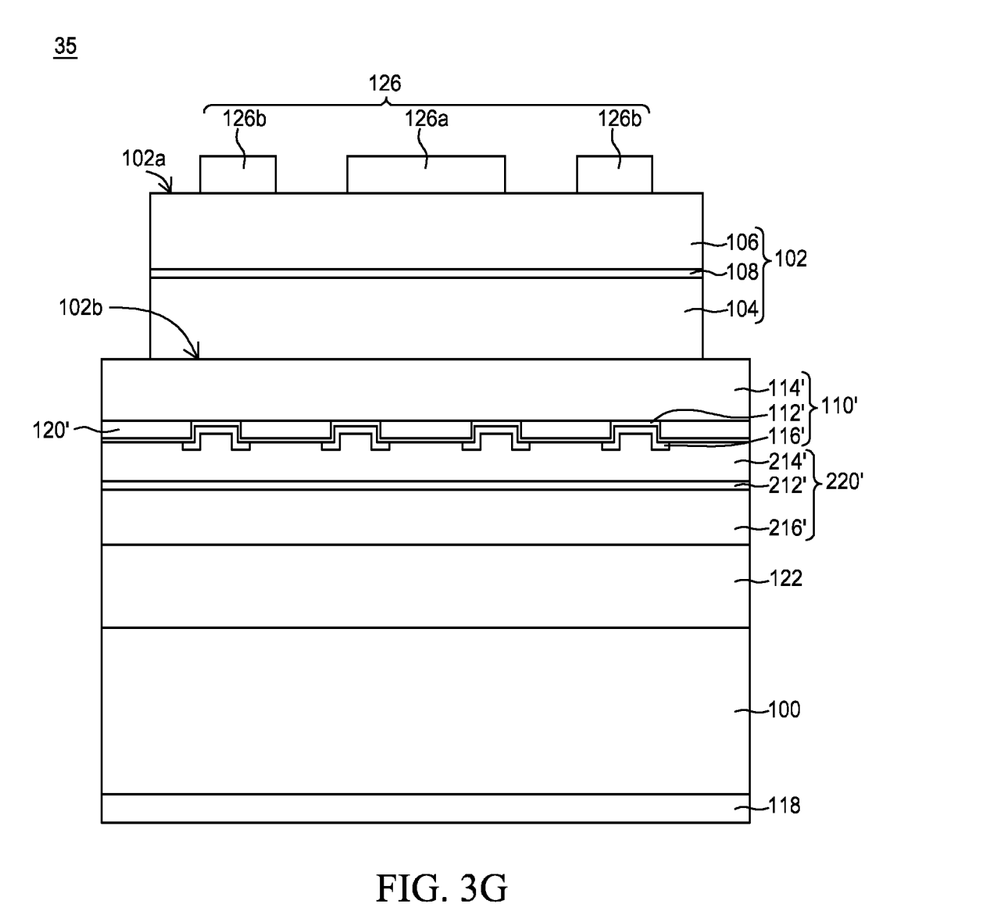
FIG. 3G shows a schematic sectional view of a semiconductor device in accordance with an embodiment of the present disclosure.

FIG. 3G shows a schematic sectional view of a semiconductor device 35 in accordance with an embodiment of the present disclosure.

The difference between the semiconductor device 35 and the semiconductor device 30 is that the semiconductor device 35 further includes a second contact structure 220'. The structure shown in FIG. 3G can be similar to a combination of structures shown in FIG. 3B and FIG. 3F. Specifically, the semiconductor device 35 includes a first contact structure 110' and a second contact structure 220' between the semiconductor stack 102 and the bonding structure 122. In the embodiment, the second contact structure 220' is located between and physically contacts the first contact structure 110' and the bonding structure 122. The second contact structure 220' includes a third semiconductor layer 214', a second metal element-containing structure 216' and a second p-type or n-type layer 212' between the third semiconductor layer 214' and the second metal element-containing structure 216'. Regarding the materials, and related descriptions of the third semiconductor layer 214', the second p-type or n-type layer 212' and the second metal element-containing structure 216', descriptions of the first semiconductor layer 114', the first p-type or n-type layer 112' and the first metal element-containing structure 116' can be referred to. The first semiconductor layer 114' and the third semiconductor layer 214' can have difference material. In an embodiment, the first semiconductor layer 114' includes a group III-V semiconductor material and the third semiconductor layer 214' includes a conductive metal oxide compound.

It should be noted that the arrangement of the first contact structure 110' and the second contact structure 220' as shown in FIG. 3G can also be applied in other embodiments described above. For example, the semiconductor device 31, 32 or 33 may further include a second contact structure 220' which can replace the reflective structure 124. For the positions, materials, and related descriptions of other layers or structures, the foregoing embodiments can be referred to, and are not repeatedly described herein.

Figure 4:
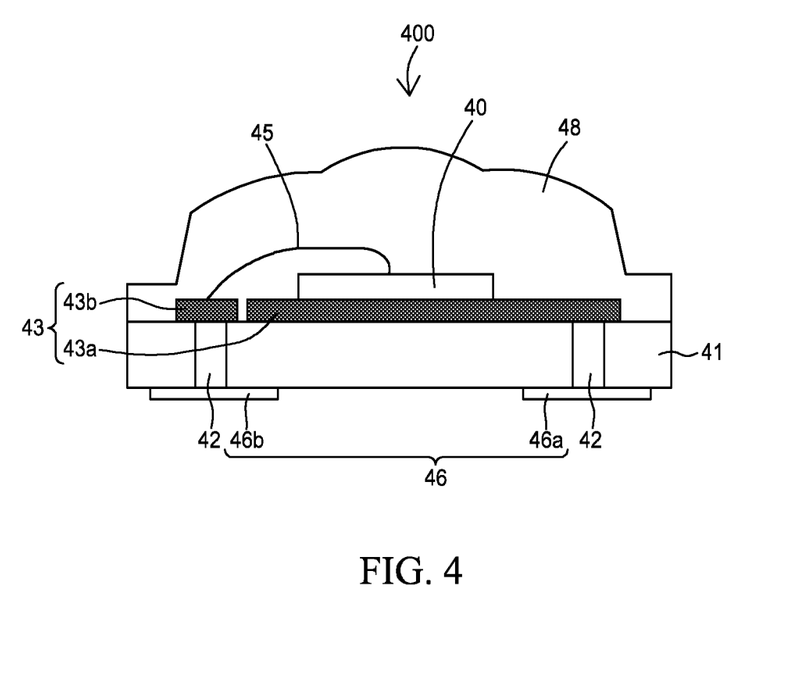
FIG. 4 shows a schematic view showing a semiconductor component of a semiconductor device in accordance with one embodiment of the present disclosure.

FIG. 4 shows a schematic view showing a semiconductor component 400 of a semiconductor device in accordance with one embodiment of the present disclosure. Referring to FIG. 4, the semiconductor component 400 includes a semiconductor device 40, a package substrate 41, a carrier 43, a bonding wire 45, a contact structure 46, and an encapsulation material 48. The package substrate 41 may comprise ceramic or glass. The package substrate 41 has a plurality of through-holes 42 therein. The through-holes 42 may be filled with a conductive material such as metal to enhance electrical conduction or/and heat dissipation. The carrier 43 is located on a surface of one side of the package substrate 41, and also contains an electrically conductive material such as metal. The contact structure 46 is on a surface on the other side of the package substrate 41. In the present embodiment, the contact structure 46 includes contact pads 46a and 46b, and the contact pads 46a and 46b can be electrically connected to the carrier 43 through the through-holes 42. In one embodiment, the contact structure 46 may further include a thermal pad (not shown), such as between the contact pad 46a and the contact pad 46b. The semiconductor device 40 is located on the carrier 43 and can be the semiconductor device described in any of the embodiments in the present disclosure. In the present embodiment, the carrier 43 includes a first portion 43a and a second portion 43b, and the semiconductor device 40 is electrically connected to the second portion 43b of the carrier 43 by the bonding wire 45. The material of the bonding wire 45 may include metal, such as gold, silver, copper, aluminum, or an alloy containing one or more of the above elements. The encapsulation structure 48 covers the semiconductor device 40 and functions to protect the semiconductor device 40. Specifically, the encapsulating structure 48 may comprise a resin material such as epoxy, silicone, or the like. The encapsulating structure 48 may further include a plurality of wavelength converting particles (not shown) to convert the first light emitted by the semiconductor device 40 into a second light. The wavelength of the second light is greater than the wavelength of the first light.

Based on the above, in accordance with the embodiments of the present disclosure, a semiconductor device, and a semiconductor component including the same can be provided. The semiconductor device provided in the present disclosure exhibits improved optical-electrical characteristics, such as contact resistance and process stability. Specifically, the semiconductor device or the semiconductor component of the present disclosure can be applied to products in various fields, such as illumination, medical care, display, communication, sensing, or power supply system. For example, the semiconductor device can be used in a light fixture, monitor, mobile phone, tablet, an automotive instrument panel, a television, computer, wearable device (such as watch, bracelet or necklace), traffic sign, outdoor display device, or medical device.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, aforementioned embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A semiconductor device, comprising:
    a semiconductor stack comprising an active layer and having a first surface and a second surface;
    a first contact structure located on the first surface and comprising
        a first semiconductor layer,
        a first metal element-containing structure comprising a first metal element, and
        a first p-type or n-type layer physically contacts the first semiconductor layer and the first metal element-containing structure; and
    an insulating structure on the first surface and covering a portion of the first semiconductor layer;
    wherein the first p-type or n-type layer comprises an oxygen element (O) and a second metal element and has a first thickness less than or equal to 20 nm, and the first semiconductor layer comprises a phosphide compound or an arsenide compound;

wherein the first metal element-containing structure does not physically contact the first semiconductor layer, the first metal element-containing structure electrically connects the first semiconductor layer through the p-type or n-type layer, and wherein the insulating structure has a second thickness larger than the first thickness.

2. The semiconductor device of claim 1, wherein the active layer comprises AlGaInAs, InGaAsP, AlGaAsP or AlGaInP.

3. The semiconductor device of claim 1, wherein the p-type or n-type layer comprises only one kind of metal elements.

4. The semiconductor device of claim 1, wherein the first semiconductor layer has a first material with a conduction band edge Ec and a valence band edge Ev, and the p-type or n-type layer has a second material with a work function WF1, when the first semiconductor layer is of an n-type conductivity, the work function WF1 fulfills WF1<(Ec+Ev)/2, and when the first semiconductor layer is of a p-type conductivity, the work function WF1 fulfills WF1>(Ec+Ev)/2.

5. The semiconductor device of claim 1, further comprising a second contact structure including a second semiconductor layer, a second metal element-containing structure and a second p-type or n-type layer located between the second semiconductor layer and the second metal element-containing structure.

6. The semiconductor device of claim 1, further comprising an electrode structure on the second surface, wherein the electrode structure comprises a main electrode and an extension electrode electrically connected to the main electrode.

7. The semiconductor device of claim 6, wherein the main electrode is not overlapped with the insulating structure in a vertical direction.

8. The semiconductor device of claim 6, wherein the extension electrode is overlapped with the insulating structure and the first p-type or n-type layer in a vertical direction.

9. The semiconductor device of claim 6, wherein the first metal element-containing structure is overlapped with the main electrode and not overlapped with the extension electrode in a vertical direction.

10. The semiconductor device of claim 1, wherein the first semiconductor layer comprises a third metal element which is the same as the second metal element.

11. A semiconductor device, comprising:
a substrate;
a reflective structure on the substrate;
a semiconductor stack on the reflective structure and comprising an active layer; and
a first contact structure located between the reflective structure and the semiconductor stack and comprising
a first semiconductor layer,
a first metal element-containing structure comprising a first metal element, and
a first p-type or n-type layer physically contacts the first semiconductor layer and the first metal element-containing structure;
wherein the first p-type or n-type layer comprises an oxygen element (O) and a second metal element and has a thickness less than or equal to 20 nm.

12. The semiconductor device of claim 11, further comprising an insulating structure between the first semiconductor layer and the reflective structure, and the insulating structure covers a portion of the first semiconductor layer.

13. The semiconductor device of claim 11, wherein the first metal element-containing structure does not physically contact the first semiconductor layer and the first metal element-containing structure electrically connects the first semiconductor layer through the p-type or n-type layer.

14. The semiconductor device of claim 11, wherein the p-type or n-type layer comprises only one kind of metal elements.

15. The semiconductor device of claim 11, wherein the active layer comprises AlGaInAs, InGaAsP, AlGaAsP or AlGaInP.

16. The semiconductor device of claim 11, wherein the first metal element is the same as the second metal element.

17. The semiconductor device of claim 11, wherein the first semiconductor layer has a first material with a conduction band edge Ec and a valence band edge Ev, and the p-type or n-type layer has a second material with a work function WF1, when the first semiconductor layer is of an n-type conductivity, the work function WF1 fulfills WF1< (Ec+Ev)/2, and when the first semiconductor layer is of a p-type conductivity, the work function WF1 fulfills WF1> (Ec+Ev)/2.

18. A semiconductor device, comprising:
a semiconductor stack comprising an active layer and having a first surface; and
a first contact structure located on the first surface and comprising
a first semiconductor layer,
a first metal element-containing structure comprising a first metal element, and
a first p-type or n-type layer physically contacts the first semiconductor layer and the first metal element-containing structure; and
an insulating structure on the first surface and covers a portion of the first semiconductor layer;
wherein the first semiconductor layer comprises a conductive metal oxide compound including indium tin oxide or indium zinc oxide, the first p-type or n-type layer comprises an oxygen element (O) and a second metal element and has a first thickness less than or equal to 20 nm;
wherein the first metal element-containing structure does not physically contact the first semiconductor layer and the first metal element-containing structure electrically connects the first semiconductor layer through the p-type or n-type layer
wherein the p-type or n-type layer has a material with a first work function WF1 and the first metal element has a second work function WF2, and when the p-type or n-type layer is of an n-type conductivity, the second work function WF2 is greater than the first work function WF1; when the p-type or n-type layer is of a p-type conductivity, the first work function WF1 is greater than the second work function WF2.

19. The semiconductor device of claim 18, wherein the insulating structure has a second thickness larger than the first thickness.

* * * * *